(12) United States Patent
Nguyen et al.

(10) Patent No.: US 6,339,728 B1
(45) Date of Patent: Jan. 15, 2002

(54) METHOD FOR MARKING SEMICONDUCTOR DEVICE USING A GREEN LASER

(75) Inventors: Quang D. Nguyen, Milpitas; Richard C. Blish, Saratoga, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/656,438

(22) Filed: Sep. 6, 2000

Related U.S. Application Data

(60) Provisional application No. 60/214,421, filed on Jun. 28, 2000.

(51) Int. Cl.$^7$ .................................................. G06F 7/66
(52) U.S. Cl. ....................... 700/125; 427/256; 427/555; 427/758; 257/678; 438/14
(58) Field of Search .......................... 159/89.12; 372/99, 372/45; 514/185; 430/5; 427/511; 700/125

(56) References Cited

U.S. PATENT DOCUMENTS 6,127,069 A * 10/2000 Balz .............................. 430/5
6,217,949 B1 * 4/2001 Corbett ....................... 427/511

* cited by examiner

Primary Examiner—John F. Niebling
Assistant Examiner—Andre C Stevenson

(57) ABSTRACT

A singulated article, such as a packaged semiconductor device is marked with a green laser, thereby broadening the scope of materials that can be marked vis-á-vis conventional infrared lasers.

17 Claims, No Drawings

METHOD FOR MARKING SEMICONDUCTOR DEVICE USING A GREEN LASER

RELATED APPLICATIONS

This application claims priority from U.S. Provisional Patent Application Ser. No. 60/214,421, filed on Jun. 28, 2000 entitled: "Method for Marking Semiconductor Device Using a Green Laser", the entire disclosure of which is hereby incorporated by reference therein.

TECHNICAL FIELD

The present invention relates to a method for marking a surface of a singulated article, such as a packaged semiconductor device, using a green laser.

BACKGROUND ART

As the production rates of semiconductor devices (frequently referred to as "chips"), including packaged dies, continue to increase, chip manufacturers search for ways to quickly and efficiently mark their products. Typically, finished semiconductor devices are marked with information, such as the company name, part number or serial number, and/or lot number. It is difficult for current marking techniques to efficiently meet the demands of increasing production rates.

Because of the deficiencies associated with ink stamping, it has become increasingly popular to use a laser beam to mark the surface of a chip package. Unlike ink stamping, laser marking is fast, requires no curing time, and produces a consistently high-quality mark with minimal set-up time. A laser beam basically burns a permanent mark into the surface of the article of manufacture; whereas inked marks have a tendency to smear, degrade, fade or erode. In the case of a packaged chip, the laser marking creates a different reflectivity from the rest of the package surface. Thus, by holding the chip at an angle to a light source, the information inscribed on the chip by the laser can be easily read.

Various machines and methods have been developed for marking a chip or other article of manufacture with an infrared laser. However, infrared lasers cannot mark on bare disc silicon because energy is transmitted though the silicon damaging the active metal layer.

Accordingly, there exists a need for methodology for marking that efficiently utilizes the speed and accuracy of a laser to precisely and clearly mark singulated semiconductor devices with better depth control.

SUMMARY OF THE INVENTION

An advantage of the present invention is an efficient, cost-effective method for marking semiconductor devices yielding better mark quality and reducing debris formation.

Another advantage of the present invention is a method for marking a silicon semiconductor device without damaging underlying active metal layers.

According to one aspect of the invention, a method for marking a surface of a singulated article, the method comprising the steps of positioning at least one article at a first marking location to be marked by a green laser beam, and marking said at least one article at said first marking location carrier for a semiconductor device is provided.

Other advantages of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

DETAILED DESCRIPTION OF THE INVENTION

Embodiments of the present invention comprise the use of a green laser for marking. Generally, chips can be automatically fed through the green laser laser marking apparatus for marking purposes. The term "chips" as used herein refers to semiconductor devices including singulated packaged dies, as well as bare dies or even partial wafers (multiple die severed as a group from a wafer). The present invention enjoys utility in the marking of many types of semiconductor devices. Moreover, the present invention enjoys utility in the marking of any singulated article (the term "singulated article" as used herein refers to any individualized object). Chips may be fed in a conventional manner, as by a belt, chain or pneumatic conveyor system, or delivered by other means known in the art.

Chips are positioned at a marking field and can be held in place while they are marked. Optional optical sensors can detect whether a chip has reached the marking field and is ready to be marked by the green laser. Once the chip(s) is marked, it is moved downstream from the marking field and the cycle repeats until all of the chips have been marked.

While the laser beam is actively marking a chip at one marking location, another chip can be moving into position at another marking location accessible by the same green laser beam source. Once a chip has been marked, the green laser source can alternate to the adjacent marking location and being marking another chip while the previously marked chip is being replaced by an umarked chip. In this manner, the green laser is substantially continually marking a chip at one or the other of the marking locations and is not waiting for chips to be positioned at a marking location.

More than one chip may be present at each marking location. That is, a plurality of chips are positioned, e.g., in a row, at each marking location, and all the chips at one marking location are marked in succession and then replaced by a like plurality of chips at another marking location.

The present invention can be practiced employing a conventional green laser. It was found that a wavelength of about 532 nm is particularly suitable for optimum definition and clarity on plastic or ceramic surfaces. Aluminum lids and gold strips can also be marked by the inventive method. Green lasers have better absorption on silicon, produce better mark quality with higher throughput and minimize the generation debris.

After a chip is marked in the marking field, it may be passed though an optional debris removal system. The debris removal system may employ suction, forced air and/or other methods known in the art to clean minute particles from the surface of the chip without disturbing the markings thereon.

Another optional optical sensor can be positioned to sense whether a chip is present and ready for inspection. If so, the chip may then be inspected by, for example, a downward-looking camera which may be a CCD camera or other suitable camera known in the art. The camera photographs the image of the surface of the chip and the markings contained thereon and sends this image to a microprocessor. The image received by the microprocessor is broken down into individual pixels and the pixels can then be compared to a minimum resolution standard. Once the image for a chip is received and compared by the microprocessor, that chip is released for further processing. If the marking on a chip are determined by the microprocessor to be unacceptable, the defectively marked chip can be recycled for rework and remarking.

If desired, the image of each inspected chip may be saved in memory for quality control/quality assurance purposes. A system capable of simultaneously inspecting all chips in a marked group may be employed in lieu of a single-chip inspection system.

As semiconductor devices become ever-smaller and employ ever-finer lead pitches, chip carriers may optionally be employed to transport packaged chips during marking and subsequent shipping. In such a situation, the chips would be employed in a carrier preferably make of a statically dissipative material, such as certain plastics and other materials known in the art. It is also contemplated that the backs of bare dies or partial wafers could also be marked if provided with an appropriate carrier.

An aspect of the present invention is laser-marking chips at the end stage of the production process, i.e., after burn-in and before shipment. This approach permits marking of only burned-in chips suitable for shipment to a customer. The present invention advantageously enables marking chips with customer-requested information when an order is received, using an inventory of unmarked chips.

Described has been a method for marking semiconductor chips with a green laser. An advantage of the invention is that it can easily be implemented and is both efficient and cost-effective in reducing damage to active metal layers that can be caused by marking with an infrared laser. The present invention facilitates fabricating and customizing various semiconductor devices. In this disclosure, there is shown and described only certain preferred embodiments of the invention, but, as aforementioned, it is to be understood that the invention is capable of use in various other combinations and environments and is capable of changes or modifications within the scope of the inventive concept as expressed herein.

What is claimed:

1. A method for marking singulated articles, the method comprising the steps of:

positioning at least one article at a first marking location to be marked by a green laser beam;

marking said at least one article at said first marking location with the green laser beam;

positioning at least a second article at a second, different, marking location while marking said at least one article at said first marking location with the green laser beam; and marking said at least a second article at said second marking location with the green laser beam while removing said at least one marked article from said first marking location and positioning at least a third unmarked article at said first marking location.

2. The method of claim 1, wherein each article is a semiconductor chip.

3. The method of claim 2, wherein the chip is selected from the group consisting of a singulated packaged dies, a bare singulated die and a partial wafer.

4. The method of claim 1, comprising marking a surface of each article, wherein the surface is selected from the group consisting of plastics, ceramics aluminum lids and gold strips.

5. The method of claim 1, wherein the green laser beam has a wavelength of about 532 nm.

6. The method of claim 1, further comprising:

removing said at least a second marked article from said second marking location and replacing it with at least a fourth unmarked article while said green laser beam is marking at least a third article at said first marking location.

7. The method of claim 6, comprising alternating marking of said articles between said first marking location and said second marking location.

8. The method of claim 7, further comprising:

marking a group of singulated articles positioned at the first marking location while replacing a group of marked singulated articles with a like group of singulated articles to be marked at the second marking location.

9. The method of claim 1, further comprising:

staging said singulated articles at a staging location before positioning said singulated articles at either of said first marking location or said second marking location.

10. The method of claim 1, further comprising:

placing marked articles in a product carrier for shipping.

11. The method of claim 10, wherein the product carrier is selected from the group consisting of tubes, trays, reels and jewel boxes.

12. The method of claim 1, further comprising:

removing debris from said surface of each marked article.

13. The method of claim 1, further comprising:

inspecting the quality of said mark applied to each marked article.

14. The method of claim 1, further comprising:

photographing each marked article.

15. The method of claim 1, further comprising:

sending an image of each marked article to a microprocessor.

16. The method of claim 14, further comprising:

comparing said image to selected marking quality control parameters.

17. The method of claim 15, further comprising:

rejecting said each marked article if said image of said mark thereon is not within said selected quality control parameters.

* * * * *